(12) United States Patent
Choi et al.

(10) Patent No.: US 7,173,276 B2
(45) Date of Patent: Feb. 6, 2007

(54) HIGHLY EFFICIENT ORGANIC LIGHT EMITTING DEVICE USING SUBSTRATE HAVING NANOSIZED HEMISPHERICAL RECESSES AND METHOD FOR PREPARING THE SAME

(75) Inventors: Hyeon Choi, Daejeon (KR); Se Hwan Son, Daejeon (KR); Sang Ho Kim, Daejeon (KR); Sun Ah Park, Seoul (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 10/936,023

(22) Filed: Sep. 8, 2004

(65) Prior Publication Data

US 2005/0029538 A1    Feb. 10, 2005

(30) Foreign Application Priority Data

Sep. 8, 2003    (KR) .................. 10-2003-0062680

(51) Int. Cl.
*H01L 51/00*    (2006.01)
(52) U.S. Cl. .................. 257/40; 438/22; 438/29; 257/E51.022
(58) Field of Classification Search ............ None
See application file for complete search history.

(56) References Cited

U.S. PATENT DOCUMENTS

2002/0061641 A1 *    5/2002    Yoda (Continued)

FOREIGN PATENT DOCUMENTS

JP    2003-31364    1/2003

(Continued)

OTHER PUBLICATIONS

Brown et al., "Energy level line-up in polymer light-emitting diode via electroabsorption spectroscopy," IEEE Proceedings—Optoelectronics, Feb. 2001, vol. 148, issue 1, p. 74-80.*

(Continued)

*Primary Examiner*—Leonardo Andujar
*Assistant Examiner*—Kevin Quinto
(74) *Attorney, Agent, or Firm*—Cantor Colburn LLP (57)    ABSTRACT

The present invention provides an organic light emitting device comprising a substrate, a first electrode, an organic material layer and a second electrode in sequentially laminated form, wherein a plurality of continued hemispherical recesses are formed on an upper surface of the substrate aligned adjacent to the first electrode. In addition, The present invention provides a method comprising the steps of a) dipping a substrate having at least one aluminum surface in an acid solution, and applying oxidation voltage of 10 to 400 V to the substrate so as to form an aluminum oxide layer on the aluminum surface of the substrate in such a manner that a plurality of continued recesses are formed on the aluminum oxide layer, and a plurality of continued recesses having curvature in identical direction to that of the recesses on the aluminum oxide layer are formed on an interface between the aluminum oxide layer and the substrate; b) removing the aluminum oxide layer from the substrate, thereby forming a plurality of continued hemispherical recesses; and c) forming an organic material layer and an electrode on one surface of the substrate formed with the hemispherical recesses.

17 Claims, 7 Drawing Sheets

U.S. PATENT DOCUMENTS

| | | | |
|---|---|---|---|
| 2002/0171088 A1 * | 11/2002 | Kahen et al. | |
| 2003/0057417 A1 * | 3/2003 | Lee et al. | |
| 2003/0104244 A1 * | 6/2003 | Aziz et al. | |
| 2004/0150979 A1 * | 8/2004 | Lambertini et al. | |

FOREIGN PATENT DOCUMENTS

| | | |
|---|---|---|
| KR | 2002-0053456 | 7/2002 |
| KR | 2003-0064028 | 7/2003 |
| WO | WO 00/70691 A1 | 11/2000 |
| WO | WO 01/33598 | 5/2001 |
| WO | WO 2003/007663 | 1/2003 |
| WO | WO 03/012890 A2 | 2/2003 |

OTHER PUBLICATIONS

"Hexagonal pore arrays with a 50-420 nm interpore distance formed by self-organization in anodic alumina"; Authors: A.P. Li, et al.; Journal of Applied Physics, vol. 84, No. 11; Dec. 1, 1998; pp. 6023-6026.

"Improved light out-coupling in organic light emitting diodes employing ordered microlens arrays"; Authors: S. Moller and S. R. Forrest; Journal of Applied Physics, vol. 91, No. 5; Mar. 1, 2002; pp. 3324-3327.

"Increased efficiency and Controlled Light Output from a Microstructured Light-Emitting Diode"; Authors: Benjamin J. Matterson, et al.; Advanced Materials, vol. 13, No. 2; Jan. 16, 2001; WILEY-VCH Verlag GmbH; pp. 123-127.

"A high-extraction-efficiency nanopatterned organic light-emitting diode"; Authors: Yong-Jae Lee, et al.; Applied Physics Letters, vol. 82, No. 21; May 26, 2003; American Institute of Physics; pp. 3779-3781.

* cited by examiner

Fig. 3 surface structure of aluminum substrate cross sectional structure of aluminum substrate

(a) first substrate          (b) second substrate          (c) third substrate (oxidation voltage 130 V)  (oxidation voltage 195 V)  (oxidation voltage 220 V)

HIGHLY EFFICIENT ORGANIC LIGHT EMITTING DEVICE USING SUBSTRATE HAVING NANOSIZED HEMISPHERICAL RECESSES AND METHOD FOR PREPARING THE SAME

TECHNICAL FIELD

The present invention relates to an organic light emitting device, and particularly to an organic light emitting device having layers including a substrate in the form of a non-planar structure. More particularly, the present invention relates to a highly efficient organic light emitting device using a substrate formed with a nano-sized hemispherical recess.

BACKGROUND ART

Organic electroluminescence means to convert electrical energy into light energy by using organic materials. That is, when voltage is applied between an anode and a cathode while aligning an organic material layer between the anode and the cathode, holes are injected into the organic material layer from the anode and electrons are injected into the organic material layer from the cathode. When the holes meet the electrons, excitons may be formed and such excitons generate light when they fall to the ground state.

Recently, research and studies are being actively carried out for fabricating displays or illumination units by using the electroluminescent phenomenon. In addition, techniques for depositing organic material layers in the form of a single layer or multi-layers are being actively studied in order to achieve effective organic light emitting devices. Most of currently available organic light emitting devices include an electrode layer and an organic material layer deposited in the form of a planar structure. Among those organic light emitting devices, an organic light emitting device having a planar multi-layer structure including an electrode layer and four organic material layers, such as a hole injection layer, a hole transport layer, a light emitting layer, and an electron transport layer as shown in FIG. 1, has been widely used.

Figure 1:
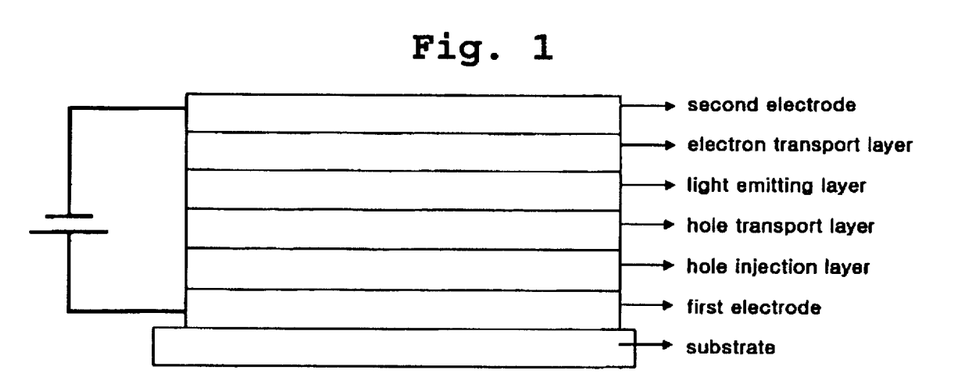
FIG. 1 shows a conventional organic light emitting device having a planar structure.

Referring to the organic light emitting device having a planar structure shown in FIG. 1, if an anode is a transparent anode and a substrate is a glass substrate, light generated from an organic material layer may pass through the transparent anode and the glass substrate. At this time, the light generated from a light emitting layer may travel through two different paths. Firstly, the light can be emitted out of the organic light emitting device. Secondly, the light may remain in the organic light emitting device while being reflected totally from the glass substrate or a surface of the anode. Among light generated from the light emitting layer, about $1/2n^2$ of the light can be emitted out of the organic light emitting device (wherein, n is a refractive index of the organic material layer). If the refractive index of the organic material layer of the device is 1.7, less than 17% of the light generated from the device can be emitted out of the organic light emitting device.

To solve the above problem and emit a large amount of light out of the organic light emitting device, an organic light emitting device structure including non-planar layer, i.e. non-planar structure has been suggested. The organic light emitting device having a structure a non-planar structure, can be fabricated through the following two methods.

According to a first method, a photonic crystal having a gravure pattern is formed on a glass substrate through a photolithography process before a transparent anode is deposited on the glass substrate (see, U.S. Publication No. 2003/0057417 and a document Appl. Phys. Lett. 82, 3779 issued on 2003 by Y. Lee et al.), or a corrugated pattern is formed on the glass substrate by using an interference of light(see, WO 2000/70691 and a document Adv. Mater. 13, 123 issued on 2001 by B. J. Matterson et al.), so as to improve light emitting efficiency. In detail, the former deposits an anode layer on the glass substrate, after forming the photonic crystal on the glass substrate and planarizing a surface of the glass substrate by using $SiN_x$. The latter deposits an electrode layer and an organic material layer on the glass substrate while maintaining a corrugated pattern, after forming the corrugated pattern of transparent polymer on the glass substrate by using photoresist materials and an interference of light.

According to a second method, after fabricating an organic light emitting device having a planar structure as shown in FIG. 1, a micro-sized lens structure (see, WO 2003/007663 and a document J. Appl. Phys. 91, 3324 issued on 2000 by S. Moller et al.) or a millimeter-sized lens structure (see, WO 2001/33598) is attached to a surface of a glass substrate of the organic light emitting device, thereby improving light emitting efficiency of the device.

The above two methods can improve the light emitting efficiency of the light emitting device. However, the above two methods do not suggest a hemispherical recess structure formed on a substrate having high reflectance in order to effectively emit light. In addition, the above two methods represent problems when they are applied to an available light emitting device.

That is, the first method uses the photolithography process, so it is impossible to form the photonic crystal structure or the corrugated structure over a large-sized area. That is, in order to fabricate the light emitting device using the photonic crystal structure, it is necessary to sequentially carry out a deposition process, a photolithography process, and an etching process. At this time, the substrate must be processed at least two times under a vacuum state. In addition, in order to fabricate the light emitting device using the corrugated structure, it is necessary to perform the photolithography process by using an interference of light. However, the photolithography process is not adaptable for forming a uniform corrugated structure over a substrate having an area more than a few cm².

The second method represents limitations when it is applied to display, because the lens structure has a size within a range of about a few micrometers to a few millimeters. In addition, the second method is not adaptable for a large-sized area due to preparation work thereof. According to the lens structure disclosed in WO 2003/007663, a minimum surface size of the lens structure is defined as a few μm such that minimum surface size of the lens structure must be larger than a maximum wavelength of visible ray emitted from the organic light emitting device. In addition, according to the lens structure disclosed in WO 2001/33598, the size of the lens structure must be larger than a size of one unit of an organic light emitting device.

DISCLOSURE OF THE INVENTION

Inventors of the present invention have found that light generated from an organic material layer can be efficiently emitted out of a light emitting device when a substrate and/or an electrode of the organic light emitting device is formed with hemispherical recesses, particularly nano-sized hemispherical recesses continuously. In addition, when an electrode has above structure, a surface area of the electrode becomes enlarged so that an amount of current applied to the organic light emitting device may increase under the same voltage condition, thereby improving brightness of the organic light emitting device. Moreover, the substrate of above structure can be fabricated through a porous aluminum oxide layer forming process, so that it is possible to fabricate a large-sized organic light emitting device having the substrate of the above structure at a low cost.

Accordingly, it is an object of the present invention to provide an organic light emitting device having a substrate formed with a plurality of hemispherical recesses, preferably, a plurality of nano-sized hemispherical recesses continuously formed in the substrate, and a method for fabricating the same.

In order to accomplish the above object, according to one aspect of the present invention, there is provided an organic light emitting device comprising a substrate, a first electrode, an organic material layer and a second electrode in sequentially laminated form; wherein a plurality of continued hemispherical recesses are formed on an upper surface of the substrate aligned adjacent to the first electrode.

In order to accomplish the above object, according to another aspect of the present invention, there is provided a method for fabricating an organic light emitting device, comprising the steps of: a) dipping a substrate having at least one aluminum surface in an acid solution, and applying oxidation voltage of 10 to 400 V to the substrate so as to form an aluminum oxide layer on the aluminum surface of the substrate, in such a manner that a plurality of continued recesses are formed on the aluminum oxide layer, and a plurality of continued recesses having curvature in identical direction to that of the recesses on the aluminum oxide layer are formed on an interface between the aluminum oxide layer and the substrate; b) removing the aluminum oxide layer from the substrate, thereby forming a plurality of continued hemispherical recesses on one surface of the substrate; and c) forming an organic material layer and an electrode on one surface of the substrate formed with the hemispherical recesses.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Hereinafter, a preferred embodiment of the present invention will be described with reference to accompanying drawings.

There are no cases in a field of organic light emitting devices of forming a "hemispherical recess" in a substrate of a light emitting device in order to fabricate the substrate having a non-planar structure. In addition, there are also no cases of using a "nano-sized structure" in order to fabricate a substrate of an organic light emitting device having a non-planar structure. Inventors of the present invention have found that the following advantages can be achieved when a plurality of nano-sized hemispherical recesses are continuously formed on an upper surface of a substrate aligned adjacent to a first electrode and preferably, on an upper surface of a first electrode aligned adjacent to the organic material layer of an organic light emitting device (see, FIG. 2).

Figure 4:
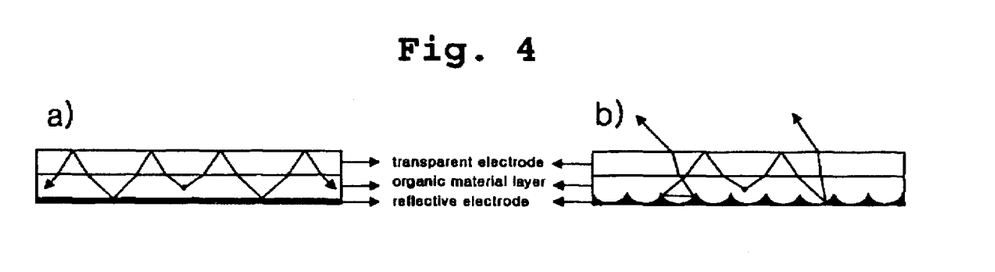
FIG. 4 shows a light route in an organic light emitting device having a substrate of a planar structure and in an organic light emitting device having a substrate formed with a plurality of hemispherical recesses.

The organic light emitting device may have a laminated structure comprising two electrodes having a high refractive index, that is, a transparent electrode through which light is outputted and an opaque electrode having high reflectance; and an organic material layer interposed between two electrodes so as to emit light as charges are injected thereto. A conventional organic light emitting device, as shown in FIG. 4(a), includes two electrodes having a planar structure so that a total internal reflection may occur at a transparent electrode having a high refractive index when light passes through the transparent electrode so as to be emitted to an atmosphere. Thus, the light may remain within the organic light emitting device. However, as shown in FIG. 4(b), in an organic light emitting device including an opaque electrode having high reflectance with a plurality of continued hemispherical recesses, light can be easily emitted to the atmosphere by reflecting from a substrate having a high reflectivity by several times, preferably one or two times.

Figure 2:
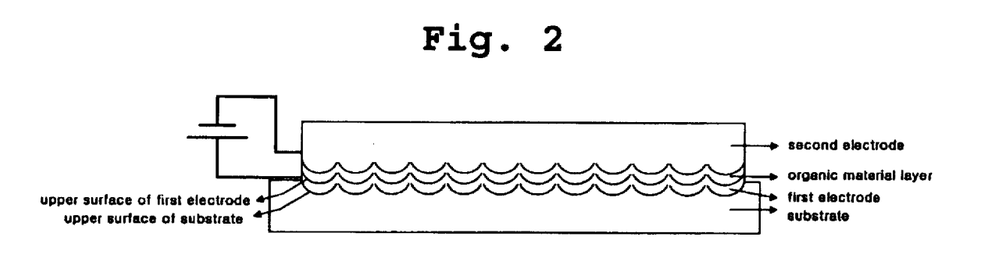
FIG. 2 shows one embodiment of an organic light emitting device according to the present invention.

In addition, as shown in FIG. 2, when an electrode and an organic material layer are deposited on a substrate having a plurality of continued hemispherical recesses, a surface area of the electrode aligned adjacent to the hemispherical recesses becomes increased as compared with a surface area of an electrode of the conventional organic light emitting device having the planar structure, so that an amount of current injected to the device may increase under the same voltage condition, thereby improving brightness of the device.

In addition, since hemispherical recesses formed on the substrate are nano-sized, the brightness of the organic light emitting device can be further improved due to a wave character of light when light is emitted out of the organic light emitting device. For instance, when a diameter of the hemispherical recess is identical to or shorter than a wavelength of a visible ray, the hemispherical recess may convert a route of light by a diffused reflection or a scattering phenomenon of light. Therefore the organic light emitting device of the present invention may relieve the total internal reflection condition of light occurring at the transparent electrode as compared with the conventional organic light emitting device having the planar structure. Thus, a larger amount of light can be emitted out of the organic light emitting device. Such effect may be maximized when the diameter of the hemispherical recesses is set within a range between a half-wavelength and one wavelength of the visible ray.

Figure 3:
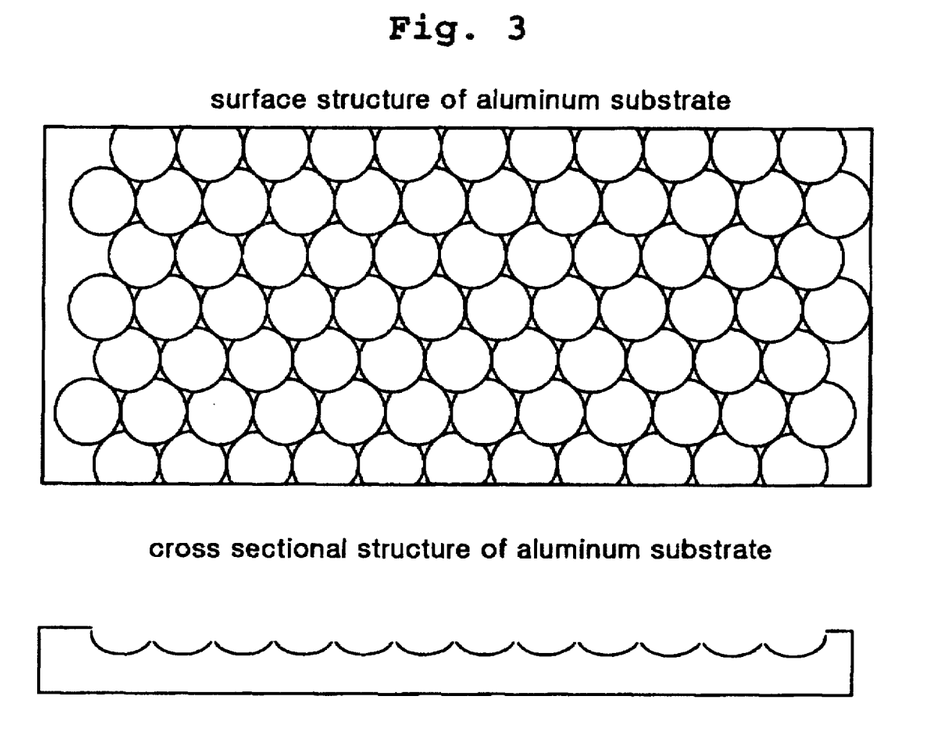
FIG. 3 shows a plan view and a cross sectional view of a substrate formed with a plurality of continued hemispherical recesses.

According to the present invention, since the wavelength of the light is very short, in order to realize the non-planar structure in relation to the wavelength of the light, it is preferred for the hemispherical recess to have a diameter identical to or less than 10 times of thickness of an organic material layer of the organic light emitting device. That is, since generally the thickness of the organic material layer of the organic light emitting device is about 100 to 500 nm, the diameter of the hemispherical recess is preferably less than or identical to 5 μm. In addition, in order to achieve the above mentioned effect of the present invention, it is more preferred for the hemispherical recess to have a diameter within a range between a half-wavelength and one wavelength of the visible ray, that is, 200 to 800 nm. The hemispherical recesses are uniformly distributed on the substrate, and preferably on the electrode of the organic light emitting device. FIG. 3 illustrates the hemispherical recess structure formed on the substrate, and preferably on the electrode of the organic light emitting device.

According to the present invention, the substrate having a plurality of continued hemispherical recesses is characterized by being fabricated through a porous aluminum oxide layer forming process. The porous aluminum oxide layer forming process is generally known. However, there are no cases of using the porous aluminum oxide layer forming process to fabricate the organic light emitting device. Inventors of the present invention have found for the first time that an organic light emitting device having a non-planar structure with a large size can be fabricated at a low cost through the porous aluminum oxide layer forming process.

The porous aluminum oxide layer forming process has been disclosed in a document [A. P. Li et al. J. Appl. Phys., 84, 6023 (1998)], etc. In detail, a substrate having at least one aluminum surface is dipped in an acid solution, such as a sulfuric acid solution, a phosphoric acid solution, an oxalic acid solution or a chromic acid solution. Then, appropriate oxidation voltage, for example 10 to 400 V is applied to the substrate so that an oxide layer, in which recesses having a diameter of about 25 to 1000 nm, preferably 200 to 800 nm, and a depth of about a few hundreds of nm to few μm are uniformly distributed, can be formed at the aluminum surface of the substrate. The depth of the recess may increase proportional to a process time. At this time, at an interface between the oxide layer and the substrate, recesses having curvature in identical direction to curvature of the hemispherical recesses are formed on the oxide layer.

Figure 7:
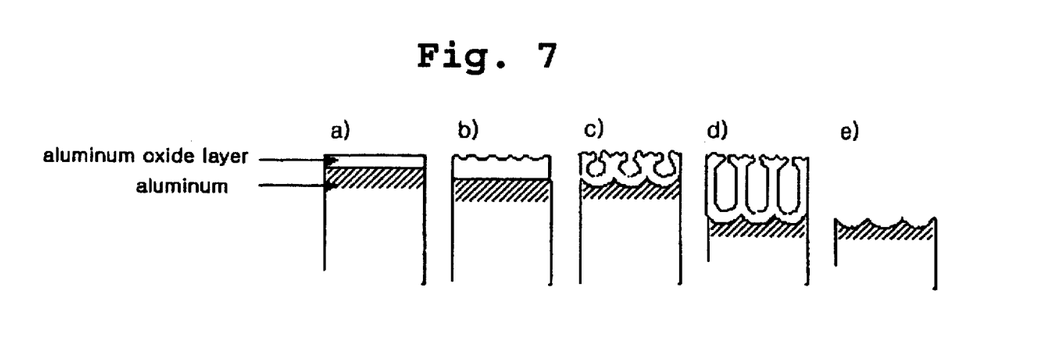
FIG. 7 shows a manufacturing process for a substrate having a plurality of continued hemispherical recesses.

FIG. 7 shows a forming process for an aluminum oxide layer through the above method. In FIG. 7, steps a) to d) represent shape-variation of the oxide layer as a function of process time. In an initial stage, a thin and uniform oxide layer is formed on an aluminum substrate (see, (a) in FIG. 7). Then, as a volume of the oxide layer is expanded, a surface of the oxide layer is irregularly deformed (see, (b) in FIG. 7). Such an irregular surface of the oxide layer may cause an uneven current density. That is, the current density may increase at a recess section of the oxide layer and may decrease at a protrusion section of the oxide layer. Then, hemispherical recesses are formed at the recess section having a high current density due to an operation of an electric field and an electrolyte of the acid solution. The diameter of the hemispherical recesses does not further increase after a predetermined time lapses (see, (c) in FIG. 7). In addition, the depth of the hemispherical recesses may rapidly increase in a vertical direction with respect to the surface of the oxide layer while constantly maintaining the number of hemispherical recesses (see, (d) in FIG. 7). As the depth of the hemispherical recesses increases, recesses having curvature in identical direction to curvature of the hemispherical recesses on the aluminum oxide layer are formed at an interface of the aluminum oxide layer and the aluminum substrate (see, (c) and (d) in FIG. 7).

The aluminum oxide layer formed on the substrate is then removed, thereby obtaining the substrate having a plurality of continued hemispherical recesses (see, (e) in FIG. 7). The aluminum oxide layer can be removed through a chemical etching process, an electrochemical etching process or an electrical shock process. However, the present invention does not limit the process for removing the aluminum oxide layer.

According to the chemical etching process, the oxide layer is etched by using an acid solution. Herein, the example of the acid solution includes a mixture of a phosphoric acid solution and a chromic acid solution. According to the electrochemical etching process, a substrate formed with the oxide layer is used as an electrode and the substrate is dipped in the acid solution so that the oxide layer is removed from the substrate through an electrochemical reaction between the oxide layer and the acid solution. Herein, the example of the acid solution includes a mixture of ethanol and $HClO_4$. According to the electrical shock process, electric shock is applied to the substrate by electrochemically adjusting voltage, thereby removing the oxide layer from the aluminum substrate.

After fabricating the substrate formed with a plurality of continued hemispherical recesses through the above process, sharp edge portions on the substrate are smoothly treated for preventing a short circuit of the organic light emitting device. For instance, the sharp edge portions of the substrate can be changed into smoothly curved surfaces through an electric etching process, a chemical etching process using $HgCl_2$, etc., or a spin coating process using polyimide-based polymer, photoacryl-based polymer or BCB (benzo cyclo butene), etc.

The present invention does not limit a material for the substrate if the substrate includes at least one aluminum surface. For instance, as the substrate of the present invention, a substrate consisting of aluminum can be used, and a substrate consisting of a glass substrate and an aluminum layer laminated on the glass substrate also can be used. When the aluminum substrate is used, aluminum having purity above 99% and a thickness above 200 nm is preferably used. When the glass substrate is used, the aluminum layer is laminated on the glass substrate through process such as a sputtering process. At this time, in order to reinforce adhesive force between the glass substrate and the aluminum layer, a chrome layer or a titanium layer having a thickness above 2 nm can be formed on the glass substrate before the aluminum is laminated on the glass substrate.

According to a method of the present invention, when the substrate has at least two aluminum surfaces, an aluminum oxide layer can be formed on only one of aluminum surfaces by protecting remaining surface, or dipping only one aluminum surface into the acid solution.

According to the present invention, it is possible to fabricate the organic light emitting device by using a substrate formed with a plurality of continued hemispherical recesses.

The organic light emitting device of the present invention can be fabricated by laminating sequentially a first electrode, an organic material layer and a second electrode on the substrates. When the substrate including the hemispherical recesses has electric conductivity, the substrate may act as a first electrode, so it is not necessary to form the first electrode between the substrate and the organic material layer.

According to the preferred embodiment of the present invention, the organic light emitting device has a structure as shown in FIG. 2. The organic light emitting device shown in FIG. 2, can be fabricated by depositing an anode on the substrate having a plurality of continued hemispherical recesses, using a metal, a metal oxide having conductivity, or an alloy thereof used for an anode, while maintaining the hemispherical recess structure of the substrate, and then depositing an organic material layer and a transparent material used for a cathode on the anode, by a sputtering process or a physical vapor deposition process, such as an E-beam evaporation process, etc.

According to another embodiment of the present invention, an organic light emitting device can be fabricated by sequentially depositing a cathode material, an organic material layer, and an anode material on the substrate having a plurality of continued hemispherical recesses (see, WO 2003/012890). In most cases of organic materials used for the organic light emitting device, mobility of holes is faster than mobility of electrons. As a result, density of holes is higher than density of electrons in most cases of organic light emitting devices. Accordingly, when the cathode is formed on the substrate having the hemispherical recesses, a surface area of the cathode becomes larger than a surface area of the anode, so that an amount of electrons injected into the organic light emitting device may increase as compared with an amount of electrons injected into the conventional organic light emitting device having the planar structure. Thus, the light emitting efficiency can be improved if the density of holes is formed identically the density of electrons in the organic light emitting device by said process.

The organic light emitting device of the present invention may includes an organic material layer in the form of a single layer structure or a multi-layer structure. The organic material layer of the multi-layer structure includes a hole injection layer, a hole transport layer, a light emitting layer and an electron transport layer, etc. The organic material layer may be formed in a smaller number of layers through a solution process, such as a spin coating process, a screen printing process or an ink jet process, instead of a physical vapor deposition process.

According to the present invention, materials used for fabricating the anode, the organic material layer and the cathode of the organic light emitting device are generally known in the art. For example, the following materials can be used for the above elements.

The anode is fabricated by using a material having a high work function in order to allow holes to be easily injected into the organic material layer. Particularly, the material for the anode includes metals, such as vanadium, chrome, copper, zinc, gold, or an alloy thereof; metal oxides, such as a zinc oxide, an indium oxide, an indium-tin-oxide (ITO), or an indium zinc oxide (IZO); a mixture of a metal and an oxide, such as ZnO:Al or SnO$_2$:Sb; and conductive polymers, such as poly (3-methylthiophene), poly [3,4-(ethylene-1,2-dioxy) thiophene (PEDT), polypyrrole, or polyaniline, etc. However, the present invention does not limit the material for the anode. Among those elements, a material having high reflectance (>50%) or a high transparent degree (>50%) is selectively used as a material for the anode in order to relieve a total internal reflection condition by a recesses structure formed at a lower portion of the organic light emitting device. In particular, according to the present invention, materials having high reflectance, such as Ag, Al, Ni, Cr, Au or an alloy including the same, are preferably used as materials for the anode.

In addition, the cathode is fabricated by using a material having a low work function in order to allow electrons to be easily injected into the organic material layer. In detail, the material for the cathode includes metals, such as Mg, Ca, Na, K, Ti, In, Yt, Li, Gd, Al, Ag, Sn, Pb, or an alloy of the same; said metals doped with electron transport materials; and multi-layer materials such as LiF/Al or LiO$_2$/Al. However, the present invention does not limit the material for the cathode. According to the present invention, in order to prepare the cathode, it is more preferred that a mixture of Mg and Ag, or Al is formed as a transparent thin film, and then a transparent conductive material, such as an ITO or an IZO, is deposited on the transparent thin film.

The hole injection layer is fabricated by using a material capable of allowing holes to be injected from the anode at a low voltage condition. It is preferred that the material for the hole injection layer has an HOMO (highest occupied molecular orbital) between the work function of the anode material and the HOMO of a peripheral organic material layer. In detail, the material for the hole injection layer includes metal porphyrine, oligothiophene, arylamine-based organic materials, hexanitrile hexaazatriphenylene, quinacridone-based organic materials, perylene-based organic materials, anthraquinone-based conductive polymer, polyaniline and polythiophene-based conductive polymer or conductive polymer, such as a dopant. However, the present invention does not limit the material for the hole injection layer.

The hole transport layer is fabricated by using a material capable of transporting holes from the anode or the hole injection layer to the light emitting layer. It is preferred that the material for the hole transport layer has high hole mobility. In detail, the material for the hole transport layer includes arylamine-based organic materials, conductive polymers, and block copolymers including a conjugate section and a non-conjugate section, etc. However, the present invention does not limit the material for the hole transport layer.

The light emitting layer is fabricated by using a material capable of generating light of a visible ray range by combining holes with electrons transferred from the hole transport layer and the electron transport layer, respectively. It is preferred that the material for the light emitting layer represents superior quantum efficiency with respect to fluorescence or phosphorescence. In detail, the material for the light emitting layer includes 8-hydroxy-quinoline aluminum complex (Alq$_3$), carbazole-based compounds, dimerized styryl compounds, BAlq, 10-hydroxybenzo quinoline-metal compounds, compounds based on benzoxazole, benzthiazole, and benzimidazole, poly(p-phenylenevinylene)-based polymers, poly phenylene vinylene(PPV)-based polymers, spiro compounds, polyfluorene, rubrene, etc. However, the present invention does not limit the material for the light emitting layer.

The electron transport layer is fabricated by using a material capable of transporting electrons from the cathode to the light emitting layer. It is preferred that the material for the electron transport layer has high electron mobility. In detail, the material for the electron transport layer includes 8-hydroxy-quinoline aluminum complex, complexes including Alq$_3$, organic radical compounds, and hydroxyflavone-metal complexes, etc. However, the present invention does not limit the material for the electron transport layer.

According to the preferred embodiment of the present invention, the organic light emitting device may include a transparent thin film aligned between the substrate and the first electrode. At this time, the transparent thin film preferably has transmittance above 50%, more preferably above 80% with respect to a visible ray. According to the present invention, the transmittance of the transparent thin film can be adjusted by selecting the proper material or thickness of the material forming the transparent thin film. This can be performed easily by one skilled in the art.

The transparent thin film may include a transparent inorganic material layer obtained by using a sol-gel reaction or an organic material layer, such as parylene, obtained through a chemical vapor deposition process. In addition, it is preferred that the transparent thin film is fabricated by using a heat resistant material having superior endurance against a deposition process for the ITO or IZO. In detail, the material for the transparent thin film includes polyimide, photoacryl, or BCB(benzo cyclo butene), etc. However, the present invention does not limit the material for the transparent thin film. When the first electrode is a transparent electrode, the transparent thin film can be formed by using the material forming the first electrode. When forming the transparent thin film, the ITO or IZO is preferably used for the anode, and copper phthalocyanine or hexanitrile hexaazatriphenylene is used for the hole injection layer.

A surface of the transparent thin film aligned adjacent to the first electrode can be formed with hemispherical recesses in match with the hemispherical recesses formed in the substrate or can be formed in a planar structure without the hemispherical recesses. Hereinafter, the transparent thin film will be described in detail with reference to FIGS. 5 and 6.

Figure 5:
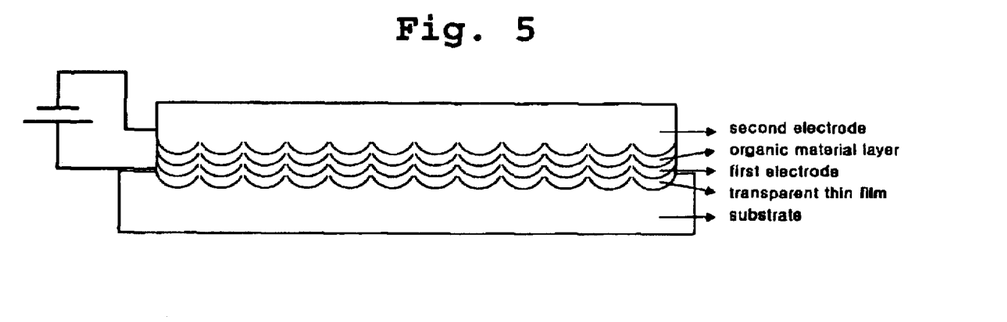
FIG. 5 shows an organic light emitting device having a transparent thin film layer laminated between a substrate and a first electrode according to one embodiment of the present invention.

Referring to FIG. 5, a transparent thin film is laminated between a substrate and a transparent anode. The transparent thin film can be obtained by coating insulation material on the substrate having hemispherical recesses while remaining hemispherical recesses of the substrate. The transparent thin film may surround sharp portions of the substrate having the hemispherical recesses, so the safety of the organic light emitting device may be improved. In addition, the transparent thin film allows an electrode formed at an upper portion thereof to have the hemispherical recesses. Thus, a surface area of the electrode may become increased so that a greater amount of current can be injected to the electrode under a low voltage condition.

Figure 6:
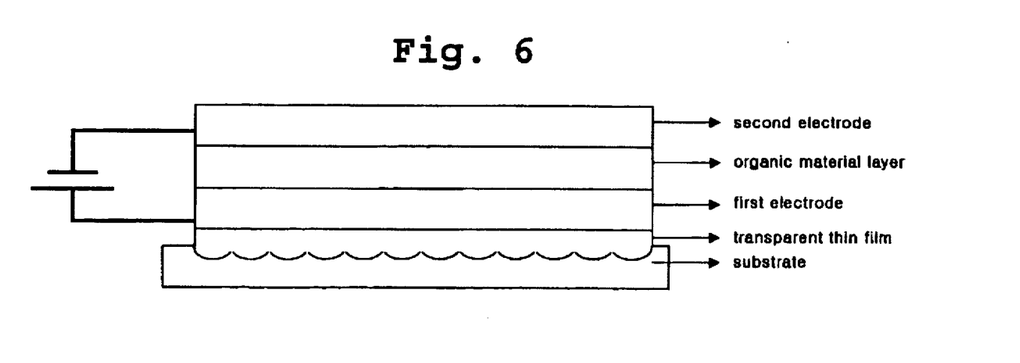
FIG. 6 shows an organic light emitting device having a transparent thin film layer laminated between a substrate and a first electrode according to another embodiment of the present invention.

Referring to FIG. 6, a transparent thin film is laminated between a substrate and an anode. However, differently from the organic light emitting device shown in FIG. 5, a surface of the transparent thin film aligned adjacent to a first electrode has a planar structure. Thus, the transparent thin film can prevent short circuit of the organic light emitting device caused by sharp portions of the aluminum substrate. In addition, devices, such as thin film transistors, can be formed on the transparent thin film, so it is possible to fabricate various electronic devices.

EXAMPLE 1

Fabrication of Substrate Having a Plurality of Continued Hemispherical Recesses

After dipping an aluminum substrate (100×100 mm, thickness: 0.7 mm, purity: 99.7%) in a phosphoric acid solution, oxidation voltage of 150 V was applied to the aluminum substrate, thereby forming an aluminum oxide layer formed with recesses having a diameter of about 200 to 400 nm and a thickness of about a few μm on the aluminum substrate. At this time, the aluminum substrate was used as a working electrode and a copper substrate was used as a counter electrode.

Then, the aluminum oxide layer was removed from the aluminum substrate by performing a chemical etching process using a mixture of the phosphoric acid solution and a chromic acid solution, thereby obtaining an aluminum substrate having a plurality of continued hemispherical recesses.

Figure 8:
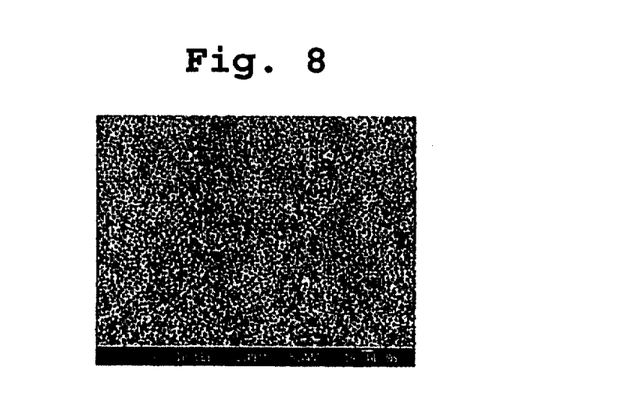
FIG. 8 is an electron microphotograph(×5,000) showing a surface of a substrate having a plurality of hemispherical recesses according to Example 1 of the present invention.
Figure 9:
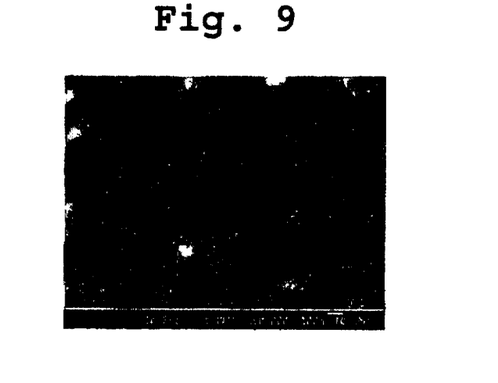
FIG. 9 is an electron microphotograph(×60,000) showing a surface of a substrate having a plurality of hemispherical recesses according to Example 1 of the present invention.

FIGS. 8 and 9 show a surface structure of the aluminum substrate fabricated through the above process, in which FIG. 8 was taken by an electron microscope (×5,000) and FIG. 9 was taken by an electron microscope (×60,000). As shown in FIGS. 8 and 9, a plurality of hemispherical recesses was uniformly formed on a large area through the above process. According to the present Example 1, the aluminum substrate has a size of 100×100 mm. However, the size of the aluminum substrate depends on a size of a counter electrode and a reaction chamber. Accordingly, the aluminum substrate can be fabricated with a size larger than 100×100 mm by adjusting the size of the counter electrode and the reaction chamber. But it cannot be easy to fabricate a substrate having a size of 100×100 mm with the non-planar structure by a conventional method.

Figure 10:
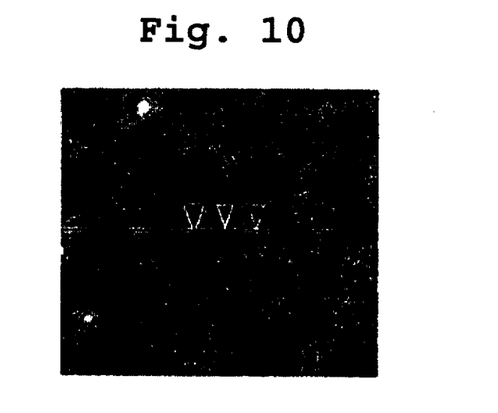
FIGS. 10 and 11, respectively, represent measurement results for a surface structure and a cross sectional structure of a substrate having a plurality of hemispherical recesses taken by an atomic force microscope according to Example 1 of the present invention.
Figure 11:
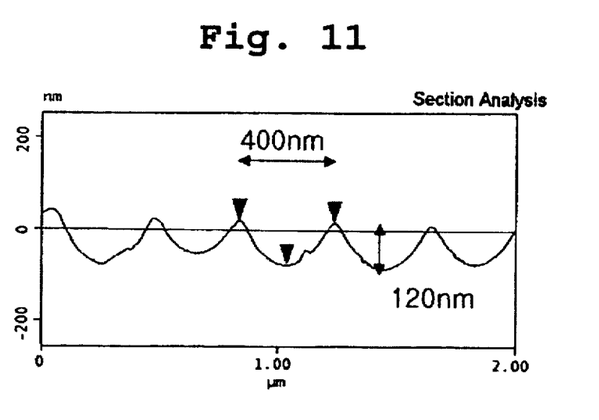

FIGS. 10 and 11 represent measurement results for a surface structure and a cross sectional structure of a substrate taken by an atomic force microscope, respectively. As shown in FIGS. 10 and 11, recesses having a substantially hemispherical structure are continuously and uniformly formed on the aluminum substrate.

Fabrication of Organic Light Emitting Device

As mentioned above, the aluminum substrate having the hemispherical recesses was used as a substrate and an anode. In addition, hexanitrile hexaazatriphenylene (500 Å), 4,4'-bis[N-(1-naphthyl)-N-phenylamino]biphenyl (NPB) (400 Å), Alq₃(500 Å), and compounds represented as the following chemical formula 1 were sequentially deposited on the aluminum substrate through a thermal vacuum deposition process, thereby forming a hole injection layer, a hole transport layer and a light emitting/electron transport layer on the aluminum substrate. Then, lithium fluoride (LiF) having a thickness of 12 Å and aluminum having a thickness of 100 Å are sequentially deposited on the light emitting/electron transport layer so as to form a cathode of an organic light emitting device. Since the cathode has a translucent property, light emission may be observed through the cathode.

[Chemical Formula 1]

In the process of fabricating the organic light emitting device, a deposition rate of the organic material was maintained at 0.4 to 0.7 Å/sec, a deposition rate of the LiF of the cathode was maintained at 0.3 Å/sec, a deposition rate of aluminum was maintained at 2 Å/sec, and a vacuum degree was maintained at $2 \times 10^{-17}$ to $5 \times 10^{-8}$ torr during the deposition process.

When a forward electric field of 7.5 V was applied to the organic light emitting device fabricated through the above process, current of 50 mA/cm² was injected into organic light emitting device. At this time, green emission was observed from Alq₃ representing a peak at 555 nm.

EXAMPLE 2

Fabrication of Substrate Having a Plurality of Continued Hemispherical Recesses

Figure 12:
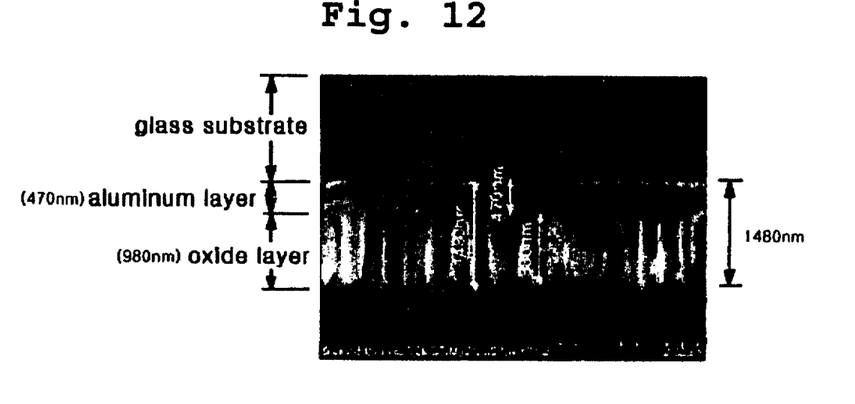
FIG. 12 is an electron microphotograph(×25,000) showing a cross sectional structure of a substrate after an oxide layer is formed on the substrate before the oxide layer is removed from the substrate according to Example 2 of the present invention.

An aluminum layer having a thickness of 1.5 μm was formed on a glass substrate (100×100 mm, thickness: 0.7 mm) through a sputtering process. Then, after dipping the glass substrate formed with the aluminum layer in a phosphoric acid solution, oxidation voltage of 195 V was applied to the substrate, thereby uniformly forming an aluminum oxide layer having a diameter of about 200 to 500 nm on the aluminum layer. FIG. 12 is an electron microphotograph showing a cross sectional structure of the oxide layer formed on the aluminum layer (×25,000). As shown in FIG. 12, the oxide layer has a thickness of about 1 μm.

Figure 13:
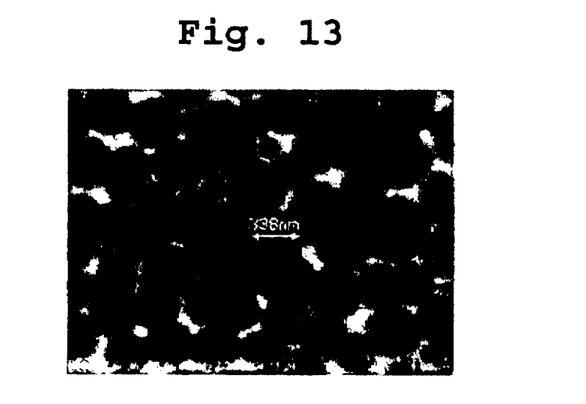
FIG. 13 is an electron microphotograph(×50,000) showing a surface structure of a substrate having a plurality of hemispherical recesses according to Example 2 of the present invention.

Then, the oxide layer was removed from the aluminum layer by performing a chemical etching process using a mixture of the phosphoric acid solution and a chromic acid solution. FIG. 13 is an electron microphotograph showings a surface structure of the aluminum layer, in which the oxide layer has been removed (×50,000). As shown in FIG. 13, the hemispherical recesses were uniformly formed on the aluminum layer.

Fabrication of Organic Light Emitting Device

The substrate having hemispherical recesses prepared as the above, was used as a substrate and an anode. Then, with the same manner as Example 1, a hole injection layer, a hole transport layer, a light emitting/electron transport layer, and a cathode are sequentially formed on the substrate.

In this state, when a forward electric field of 7,4 V was applied to the organic light emitting device fabricated through the above process, current of 50 mA/cm$^2$ was represented. At this time, green emission was observed from Alq$_3$ representing a peak at 536 nm. The green emission did not vary depending on a viewing angle.

Figure 14:
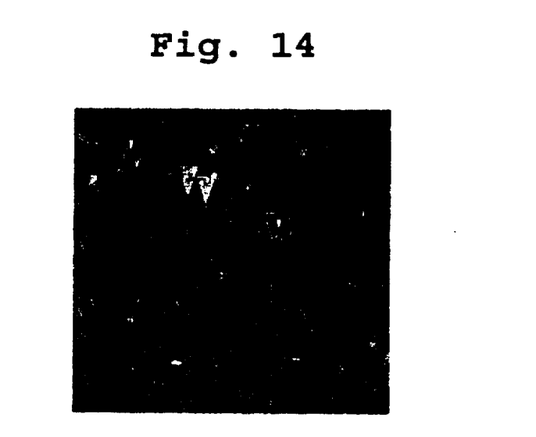
FIGS. 14 and 15, respectively, represent measurement results for a surface structure and a cross sectional structure of a cathode of an organic light emitting device taken by an atomic force microscope according to Example 2 of the present invention.
Figure 15:
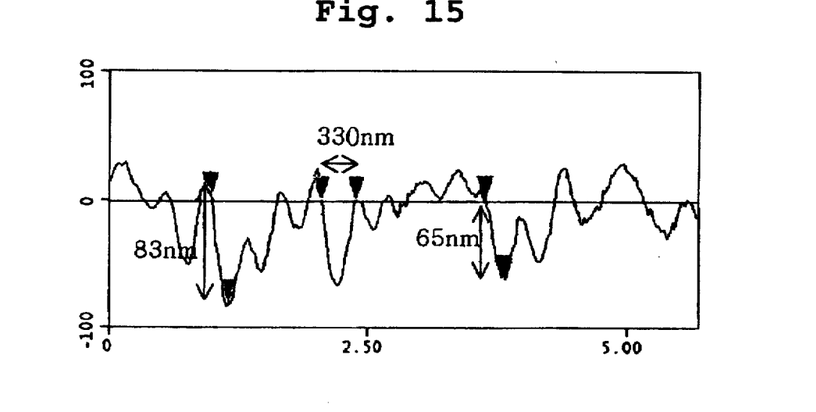

FIGS. 14 and 15 represent measurement results for a surface structure and a sectional structure of the cathode of the organic light emitting device taken by an atomic force microscope, respectively. It is understood from FIGS. 14 and 15 that nano-sized hemispherical recesses were partially maintained at the surface of the cathode of the organic light emitting device.

EXAMPLE 3

Figure 16:
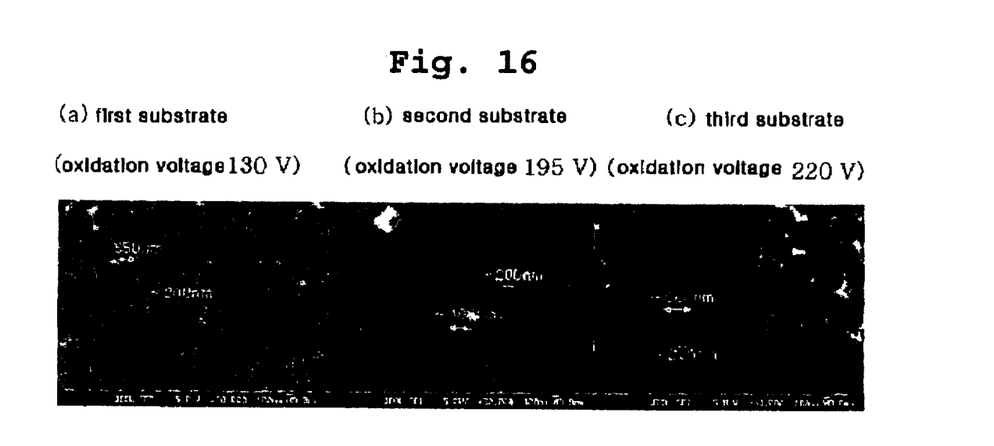
FIG. 16 is an electron microphotograph(×30,000) showing surface structures of substrates having a plurality of hemispherical recesses according to Example 3 of the present invention.

Three substrates (first to third substrates) having hemispherical recesses were fabricated in the same manner as Example 2, except that oxidation voltages of 130 V, 195 V and 220 V were applied to the first to third substrates, respectively. According to the inspection for the first to third substrates by means of an electron microscope, an average value of the diameters of the hemispherical recesses increased in proportional to oxidation voltages applied to the substrates(FIG. 16). Besides the first to third substrates, a fourth substrate was further fabricated through the above method without forming the hemispherical recesses in the fourth substrate.

After that, reflectance of the first to fourth substrates was measured by means of an n & k Analyzer (n & k Technology) while setting an incident angle of the n & k Analyzer to 3°. The reflectance of the first to fourth substrates was obtained by measuring an amount of light reflected at a reflection angle of 3°. The substrates reflect or scatter the visible ray. At this time, absorption or transmission of the visible ray by the substrates can be disregarded. Thus, the lower value of the reflectance of substrates means that a larger amount of visible rays is scattered by substrates.

Aluminum layers of the substrates were formed through the sputtering process before oxide aluminum layers have been formed. It had been observed that a large domain was formed on the aluminum layer during the sputtering process. As a result, the fourth substrate had reflectance below 80% at a visible ray area.

Figure 17:
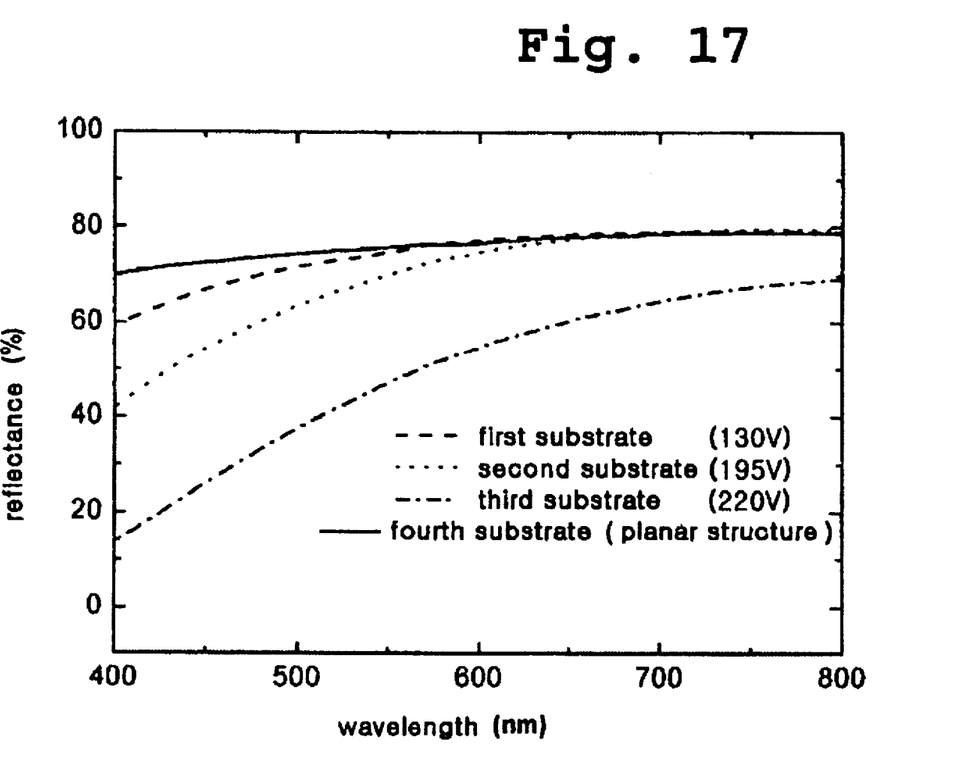
FIG. 17 shows reflectance of light obtained at a planar aluminum substrate and substrates having a plurality of hemispherical recesses of different sizes respectively according to Example 3 of the present invention.

FIG. 17 is a graph showing a test result for reflectance of the substrates. As shown in FIG. 17, the substrate having the hemispherical recess represents reflectance lower than reflectance of the substrate without the hemispherical recess at the visible ray area. In addition, as oxidation voltage applied to the substrate during the fabrication of the substrate increases, reflectance at the visible ray area of the substrate becomes reduced.

Accordingly, it is understood from the above result that the nano-sized hemispherical recesses may interact with the visible ray so that the reflectance of the substrate can be reduced. Therefore, if the substrate having the nano-sized hemispherical recesses is employed for the organic light emitting device, that it is possible to reduce confinement of light by total reflection at the transparent electrode by a scattering effect of light. Thus, it is possible to fabricate the high efficient organic light emitting device.

EXAMPLE 4

Fabrication of Organic Light Emitting Device

The substrate having hemispherical recesses was fabricated in the same manner as Example 2. Then, Aluminum (500 Å) and LiF (15 Å) were sequentially deposited by thermal evaporation process on the substrate and used as a cathode. Then, compounds represented as the following chemical formula 1(200 Å), Alq$_3$(300 Å), 4,4'-bis[N-(1-naphthyl)-N-phenylamino] biphenyl (NPB) (400 Å), and hexanitrile hexaazatri-phenylene (700 Å) were sequentially deposited on the cathode through a thermal vacuum deposition process, thereby forming an electron transport layer, a light emitting layer, a hole transport layer, and a hole injection layer. Then IZO (Indium Zinc Oxide,1500 Å) was deposited by sputtering process and used as an anode. Since the IZO anode has a transparent property, light emission may be observed through the anode.

When a forward electric field of 6.7 V was applied to the organic light emitting device fabricated through the above process, current of 100 mA/cm$^2$ was observed. At this time, green emission was observed from Alq$_3$ and the luminance was 5230 cd/m$^2$.

COMPARATIVE EXAMPLE

The organic light emitting device was fabricated using the same process as Example 4, except for using aluminum substrate without hemispherical recess.

When a forward electric field of 6.9 V was applied to the organic light emitting device fabricated through the above process, current of 100 mA/cm$^2$ was observed. At this time, green emission was observed from Alq$_3$ and the luminance was 3340 cd/m$^2$.

By comparing results from Example 4 and Comparative example, the organic light emitting device with hemispherical recesses on the substrate needs less voltage for the same current injection and shows the better luminance than the organic light emitting device without hemispherical recesses on the substrate.

INDUSTRIAL APPLICABILITY

As can be seen from the foregoing, the organic light emitting device having a plurality of hemispherical recesses, which are continuously formed on the substrate, and preferably on the electrode of the organic light emitting device can maximally emit light generated from the organic material layer out of the organic light emitting device by the hemispherical recesses. In addition, since a surface area of the electrode becomes enlarged, an amount of current applied to the organic light emitting device may increase under the same voltage condition, thereby improving brightness of the organic light emitting device. In addition, the substrate having the above-mentioned structure can be fabricated with a large size at a low cost through a porous aluminum oxide layer forming process. Thus, the organic light emitting device according to the present invention is adaptable for use in a large area economically.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. An organic light emitting device comprising a substrate, a first electrode, an organic material layer, and a second electrode in sequentially laminated form; wherein, on an upper surface of the substrate aligned adjacent to the first electrode, a plurality of continued hemispherical recesses that are opaque and reflect light are formed.

2. The organic light emitting device as claimed in claim 1, wherein each of the hemispherical recesses has a diameter of 25 to 1000 nm.

3. The organic light emitting device as claimed in claim 1, wherein the upper surface of the substrate aligned adjacent to the first electrode is formed with aluminum.

4. The organic light emitting device as claimed in claim 1, wherein the substrate is made from aluminum.

5. The organic light emitting device as claimed in claim 1, wherein the substrate includes a glass layer and an aluminum layer laminated on the glass layer.

6. The organic light emitting device as claimed in claim 1, wherein the substrate has a function identical to that of the first electrode so that the first electrode is replaced with the substrate.

7. The organic light emitting device as claimed in claim 1, wherein the substrate is fabricated through a method comprising the steps of:
  a) dipping a substrate having at least one aluminum surface in an acid solution, and applying oxidation voltage of 10 to 400 V to the substrate so as to form an aluminum oxide layer on the aluminum surface of the substrate, in such a manner that a plurality of continued recesses are formed on the aluminum oxide layer, and a plurality of continued recesses having curvature in identical direction to that of the recesses on the aluminum oxide layer are formed on an interface between the aluminum oxide layer and the substrate; and
  b) removing the aluminum oxide layer from the substrate, thereby forming a plurality of continued hemispherical recesses on one surface of the substrate.

8. The organic light emitting device as claimed in claim 1, wherein the continued hemispherical recesses face the organic material layer, and the first electrode is disposed between the continued hemispherical recesses and the organic material layer.

9. The organic light emitting device as claimed in claim 1, further comprising a transparent thin film laminated between the substrate and the first electrode.

10. The organic light emitting device as claimed in claim 9, wherein the transparent thin film, which is aligned adjacent to the first electrode, is formed at an upper surface thereof with corresponding hemispherical recesses in match with a plurality of continued hemispherical recesses formed on the substrate.

11. The organic light emitting device as claimed in claim 9, wherein an upper surface of the transparent thin film, which is aligned adjacent to the first electrode, has a planar structure.

12. The organic light emitting device as claimed in claim 1, wherein the organic material layer includes a single layer or at least two layers.

13. The organic light emitting device as claimed in claim 12, wherein the organic material layer includes a hole injection layer, a hole transport layer, a light emitting layer and an electron transport layer.

14. A method for fabricating an organic light emitting device, comprising the steps of:
  a) dipping a substrate having at least one aluminum surface in an acid solution, and applying oxidation voltage of 10 to 400 V to the substrate so as to form an aluminum oxide layer on the aluminum surface of the substrate in such a manner that a plurality of continued recesses are formed on the aluminum oxide layer, and a plurality of continued recesses having curvature in identical direction to that of the recesses on the aluminum oxide layer are formed on an interface between the aluminum oxide layer and the substrate;
  b) removing the aluminum oxide layer from the substrate, thereby forming a plurality of continued hemispherical recesses on the surface of the substrate; and
  c) forming an organic material layer and an electrode on one surface of the substrate formed with the hemispherical recesses.

15. The method as claimed in claim 14, wherein, in step b), the aluminum oxide layer is removed from the substrate through one selected from the group consisting of a chemical etching process, an electrochemical etching process and an electric shock process.

16. The method as claimed in claim 14, wherein, in step c), the organic material layer and the electrode are formed on the substrate through a physical vapor deposition process.

17. The method as claimed in claim 14, wherein, in step c), the organic material layer is formed on the substrate through a solution process.

* * * * *